US005493445A

United States Patent [19]

Sexton et al.

[11] Patent Number: 5,493,445
[45] Date of Patent: Feb. 20, 1996

[54] LASER TEXTURED SURFACE ABSORBER AND EMITTER

[75] Inventors: Douglas A. Sexton; Stephen D. Russell; Donald J. Albares, all of San Diego, Calif.

[73] Assignee: The United States of America as represented by the Secretary of the Navy, Washington, D.C.

[21] Appl. No.: 274,564

[22] Filed: Jul. 13, 1994

Related U.S. Application Data

[63] Continuation of Ser. No. 970,558, Oct. 23, 1992, which is a continuation-in-part of Ser. No. 501,707, Mar. 29, 1990, Pat. No. 5,385,633, Ser. No. 508,317, Apr. 10, 1990, Pat. No. 5,354,420, and Ser. No. 589,839, Sep. 26, 1990, Pat. No. 5,164,324.

[51] Int. Cl.$^6$ ............................. G02B 5/20; H01J 15/00
[52] U.S. Cl. ......................... 359/614; 359/602; 359/855
[58] Field of Search ........................ 219/121.68, 121.69, 219/121.61, 121.67, 121.89; 359/602, 614, 855; 356/234

[56] References Cited

U.S. PATENT DOCUMENTS

| | | |
|---|---|---|
| 2,891,879 | 6/1959 | Rohrer . |
| 3,648,056 | 3/1972 | Buttweiler et al. ............... 359/614 |
| 3,778,585 | 12/1973 | Mallozzi et al. . |
| 3,866,398 | 2/1975 | Vernon, Jr. et al. . |
| 3,908,457 | 9/1975 | Drong et al. ............... 359/602 |
| 3,939,706 | 4/1976 | Pinson . |
| 4,181,538 | 1/1980 | Narayan et al. . |
| 4,211,601 | 7/1980 | Mogab . |
| 4,260,649 | 4/1981 | Dension et al. . |
| 4,267,523 | 5/1981 | Brown . |
| 4,271,396 | 6/1981 | Brown . |
| 4,331,504 | 5/1982 | Chuang et al. . |
| 4,409,463 | 10/1983 | Duruz et al. . |
| 4,478,677 | 10/1984 | Chen et al. . |
| 4,490,211 | 12/1984 | Chen et al. . |
| 4,511,216 | 4/1985 | Hsu et al. . |
| 4,545,823 | 10/1985 | Drowley . |
| 4,634,223 | 1/1987 | Isbii ............... 359/614 |
| 4,734,157 | 3/1988 | Carbaugh et al. . |
| 4,737,000 | 4/1988 | Garlick et al. . |
| 4,776,671 | 10/1988 | Sumi et al. ............... 359/885 |
| 4,836,887 | 6/1989 | Dabewspeck et al. . |
| 4,864,098 | 9/1989 | Basanese et al. . |
| 4,865,923 | 9/1989 | Ralston et al. . |
| 4,904,340 | 2/1990 | Miracky et al. ............... 219/121.69 |
| 4,929,834 | 5/1990 | Liefson ............... 359/614 |
| 5,024,968 | 6/1991 | Engelsberg . |
| 5,061,643 | 10/1991 | Yagi . |
| 5,164,324 | 11/1992 | Russell et al. ............... 437/19 |
| 5,221,840 | 6/1993 | Boutet ............... 356/236 |

OTHER PUBLICATIONS

Bauerle, P.; Appl. Phys. B, 46, 261–270, 1988.
Boyle et al; NRL Report 6482, pp. 1–7, Jun. 12, 1989.
Russell et al, Proceedings Material Research Society, NTISAO-A217 425/8/XAB, 14 pp., 1989, abstract only supplied herewith.
Heimann et al, J. Appl. Phys., vol. 53, #9, pp. 6240–6245, Sep. 1982 abst. only herewith.
Day et al, Applied Optics, vol. 15, No. 7, pp. 1865–1868, Jul. 1976; NBS; abst. only supplied herewith.
Brewer et al., Photon–Assisted Dry Etching of GaAs, Appl. Phys. Lett., 45(4), 15 Aug. 1984.

(List continued on next page.)

Primary Examiner—Nelson Moskowitz
Attorney, Agent, or Firm—Harvey Fendelman; Thomas Glenn Keough

[57] ABSTRACT

A light stop having at least one appropriately laser textured surface assures the absorption of energy including laser emissions that impinge on the at least one surface to thereby inhibit reflected energy therefrom. Optionally, an improved emitter of energy is created by at least one appropriately laser textured surface having an increased surface area of emission to increase the emissive power of the surface to thereby provide improved conductive and radiative cooling. An improved absorber and emitter is fabricated by providing front side and backside textured surfaces. All these capabilities are provided in a variety of structural configurations.

28 Claims, 4 Drawing Sheets

OTHER PUBLICATIONS

Rytz–Froidexaux et al., Laser Generated Microstructures, Appl. Physl. A., vol. 37, 121–138 (1985).
Singer, Laser Planarized Metal Shows Several Advantages, Semiconductor Int'l., vol. 13, No. 6, May 1990, pp. 18–20.
Kaminsky, Micromachining of Silicon Mechanical Structures, J. Vac. Sci. Technol. B, vol. 3, No. 4, Jul./Aug. 1985, pp. 1015–1024.
Gutmann, Halogen Chemistry, vol. 2, (New York; Academic Press, 1967) pp. 173–189.
Winters et al. Surface Processes in Plama–Assisted Etching Environments, J. Vac. Sci. Tech. B, vol. 1, (1983), p. 469.
Heath et al., Plasma Processing for VLSI, Academic Press, 1985, San Diego, pp. 487–502.
Osgood, Jr. et al., Localized Laser Etching of Compound Semiconductors in Aqueous Solution, App. Phys. Lett., vol. 40, 1982, p. 391.
Russell et al., Excimer Laser–Assisted Etching of Si using Chloropentafluoroethane, Mat. Res. Soc. Proc., vol. 158, 1990, pp. 325–330.
Mogyorosi et al., Laser–Induced Chemical Etching–Atmospheres II Cont. Irr., vol 45,293 (1988).
Ehrlich et al., A Review of Laser–Microchemical Processing, J. Vac. Sci. Tech. B, vol. 1, p. 969 (1983).
Houle, Basic Mechanisms in Laser Etching and Deposition, Appl. Phys. A, vol. 41,315 (1986).
Bauerle, Chem. Processing with Lasers: Recent Developments, Appl. Phys. B, vol. 46,261 (1988).
Chuang, Laser–Induced Chemical Etching . . . Challenges, Mat'ls Tes. Soc. Symposia Proc., vol. 29, 1989, pp. 185–194.
von Gutfeld et al., Laser–Enhanced Etching–In Kotle, App. Phys. Lett., vol. 40, 1982, p. 352.
Bunkin et al., Laser Control over Electrochemical Processes, SPIE vol. 473, Symposium Optika '84, pp. 31–37.
Brunauer et al., Adsorption of Gases in Multimolecular Layers, J. Am. Chem. Soc., vol. 60,1938, p. 307.
Gauthier et al., Mechanism Investigations–Induced Desorption, Phys. Stat. Sol. (A), vol. 38, 1976, p. 447.
Kullmer et al., Laser–Induced Chemical Etching–In Chlorine Atmosphere: I Pulsed Irr., vol. 45,293(1988).
Kullmer et al., Laser–Induced Chem. Etching–III Combined CW and Pulsed Irr., vol. 47,377, (1988).
Horiike et al., Excimer–Laser Etching on Silicon, Appl. Phys. A, vol. 44,313, (1987).
Palmer et al., Laser–Induced Etching–by $F_2$/NE, Conf. on Lasers–Series 1988, vol. 7,284, Opt. Soc. of America.
Brannen, Chemical Etching of Silicon–Dissociation of $NF_3$, Appl Phys. A, vol. 46,39 (1988).
Chuang, Infrared Laser Radiation Effects–with Silicon, J. Chem. Phys., vol. 74, 1461 (1981).
Houle, Photoeffects–Influence of Doping on Steady–State Phenomena, J. Chem. Phys., vol. 79, 4237 (1983).
Houle, Photoeffects–Response to Light, J. Chem. Phys., vol. 80, 4851 (1984).
Chuang, Multiple Photon Excited $SF_6$ Interaction with Silicon Surfaces, J. Chem. Phys., vol. 74, 1453, 1981.
Armacost et al, 193 NM Excimer Laser–Assisted Etching of Polysilicon, Mat. Res. Soc. Symp. Proc, vol. 76, (1987), pp. 147–156.
Ehrlich et al., Laser–Induced Microscopic Etching of GaAs and InP, Appl. Phys. Lett., 36(8), 15 Apr. 1980.
Russell et al., Proceedings Material Research Society, N & IS AD–A217 425/8/XAB, 14 pp., 1989, abstract only supplied herewith.
Heimann et al., J. Appl. Phys., vol. 53, #9, pp. 6240–6245, Sep. 1982 abst. only herewith.
Day et al., Applied Optics, vol. 5, No. 7, pp. 1865–1868, Jul. 1976; NBS; abst. only supplied herewith.
Sesselmann et al., Chlorine surface interaction and laser–induced surface etching reactions, J. Vac. Sci. Technol. B, 3(5), Sep./Oct. 1985.
Kullmer et al., Laser–Induced Chemical Etching of Silicon in Chlorine Atmosphere, Appl. Phys. A., vol. 43, 227–232 (1987).
Boyle et al., Eye/Sensor Protection Against Laser Irradiation Organic Nonlinear Optical Materials, NRL Memorandum Report 6482, Jun. 12, 1989.
U.S. patent application Ser. No. 07/501,707, filed Mar. 29, 1990, by Russell et al.
U.S. patent application Ser. No. 07/508,317, filed Apr. 10, 1990, by Russell et al.
U.S. patent application Ser. No. 07/589,839, filed Sep. 26, 1990, by Russell et al.
U.S. patent application Ser. No. 07/970,558, filed Nov. 23, 1992, by Sexton et al.

5,493,445

LASER TEXTURED SURFACE ABSORBER AND EMITTER

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This is a continuation of application Ser. No. 07/970,558, filed Oct. 23, 1992 which is a continuation in part of copending U.S. patent applications entitled "Method of Laser Assisted Silicon Etching Using Halocarbon Ambients" by Stephen D. Russell et al., U.S. Patent and Trademark application Ser. No. 07/501,707 filed Mar. 29, 1990 (NC 71,978) issued as U.S. Pat. No. 5,385,633 and "Method of Laser-Assisted Etching of III-V and II-VI Semiconductor Compounds Using Chlorofluorocarbon Ambients" by Stephen D. Russell et al., U.S. Patent and Trademark application Ser. No. 07/508,317 filed Apr. 10, 1990 (NC 72,726) issued as U.S. Pat. No. 5,354,420 and "Laser Texturing" by Stephen D. Russell et al, U.S. Patent and Trademark application Ser. No. 07/589,839 filed Sep. 26, 1990 (NC 73,014) issued as U.S. Pat. No. 5,164,324 issued Nov. 17, 1992 and incorporates all references and information thereof by reference herein.

BACKGROUND OF THE INVENTION

Laser light stops require a nonreflecting surface, high damage thresholds, and a means to trap scattered light. An example of a prior art laser light stop or beam dump BD is shown in FIG. 1. A conical portion CP is enclosed within a light confining box BX such that a laser beam passing through an aperture portion AP in the box will impinge on the conical portion thereby scattering light within the confines of the box. The conical portion and the interior of the box are typically painted or anodized black to inhibit reflections. The most obvious drawbacks from this technique are that there is a low damage threshold of the paint or anodized surface and that the bulky enclosure is not suitable for insertion between spatially confining optical setups or micro-optical modules. As a consequence, there is a need for more suitable alternative light absorbing devices and surfaces.

The interrelationship between the absorbing and emitting properties of a body are derived from Kirchoff's law, i.e. the ratio of radiant emittance to absorptance is the same for all surfaces at the same temperature. In accordance with this law, polished metallic surfaces having high reflectance and hence low absorptance, also have low radiant emittance. For a body losing energy to its surroundings by radiation, the total emissive power is defined as the total energy emitted per second from one square centimeter of surface. Therefore, the increase in surface area of a body results in an increase in the emitted radiation.

In general, this energy is radiated over a range of wavelengths throughout the electromagnetic spectrum. This spectral distribution is dependent, in part, on the temperature of the body. By definition, a body which is a perfect absorber is called a blackbody. The energy radiated per unit area per unit time (W) of a blackbody at a given temperature (T) is given by the equation:

$$W = \sigma(T^4 - T_0^4),$$

where $T_0$ is the temperature of its surroundings, and $\sigma$ is the Stefan-Boltzman constant ($\sigma = 5.67 \times 10^{-8}$ W/(m$^2$K$^4$)). For a "gray" body, i.e. imperfect absorber and emitter, the total energy radiated per unit area per second ($W_{gray}$) is given by:

$$W_{gray} = e\sigma(T_A^4 - T_0^4)$$

where $T_A$ is the actual temperature of the emitter, and e is the emissivity of the surface. Consequently, methods which increase the emissivity of a body therefore provide increased radiant energy for a given temperature, and more closely approximate a blackbody providing increased radiation efficiency.

Thus, in accordance with this inventive concept a need has been found to exist in the state of the art for a method to create a surface absorber or emitter which has applications in, for example, a laser light stop or microelectronic filaments, resistors and energy absorbing/emitting devices which overcomes the limitations inherent in the prior art as referred to above.

SUMMARY AND OBJECTS OF THE INVENTION

The present invention is directed to providing an optical energy (light) stop having at least one appropriately laser textured surface for assuring the absorption of energy including laser emissions that impinge on the at least one surface to thereby inhibit reflected energy therefrom. Optionally, an improved emitter of energy is created by at least one appropriately laser textured surface having an increased surface area of emission to increase the emissive power of the surface to thereby provide improved conductive and radiative cooling. An improved absorber and emitter is fabricated by providing front side and backside textured surfaces.

An object of the invention is to provide an apparatus having an increased surface area to improve its surface absorption and emission properties.

Another object is to provide an apparatus having an increased surface area by surface laser texturing to give an optical energy (light) stop capability.

Another object is to provide an apparatus having an increased surface area by surface texturing to assure enhanced heat dissipation therefrom.

Still another object is to provide an apparatus for increasing a surface area by laser emissions to assure an improved conductive and radiative cooling.

These and other objects of the invention will become more readily apparent from the ensuing specification and drawing when taken in conjunction with the appended claims.

BRIEF DESCRIPTION OF THE DRAWINGS

FIG. 6 shows another representative arrangement having a textured surface for effecting the improved absorption.

DESCRIPTION OF THE PREFERRED EMBODIMENT

Figure 2:
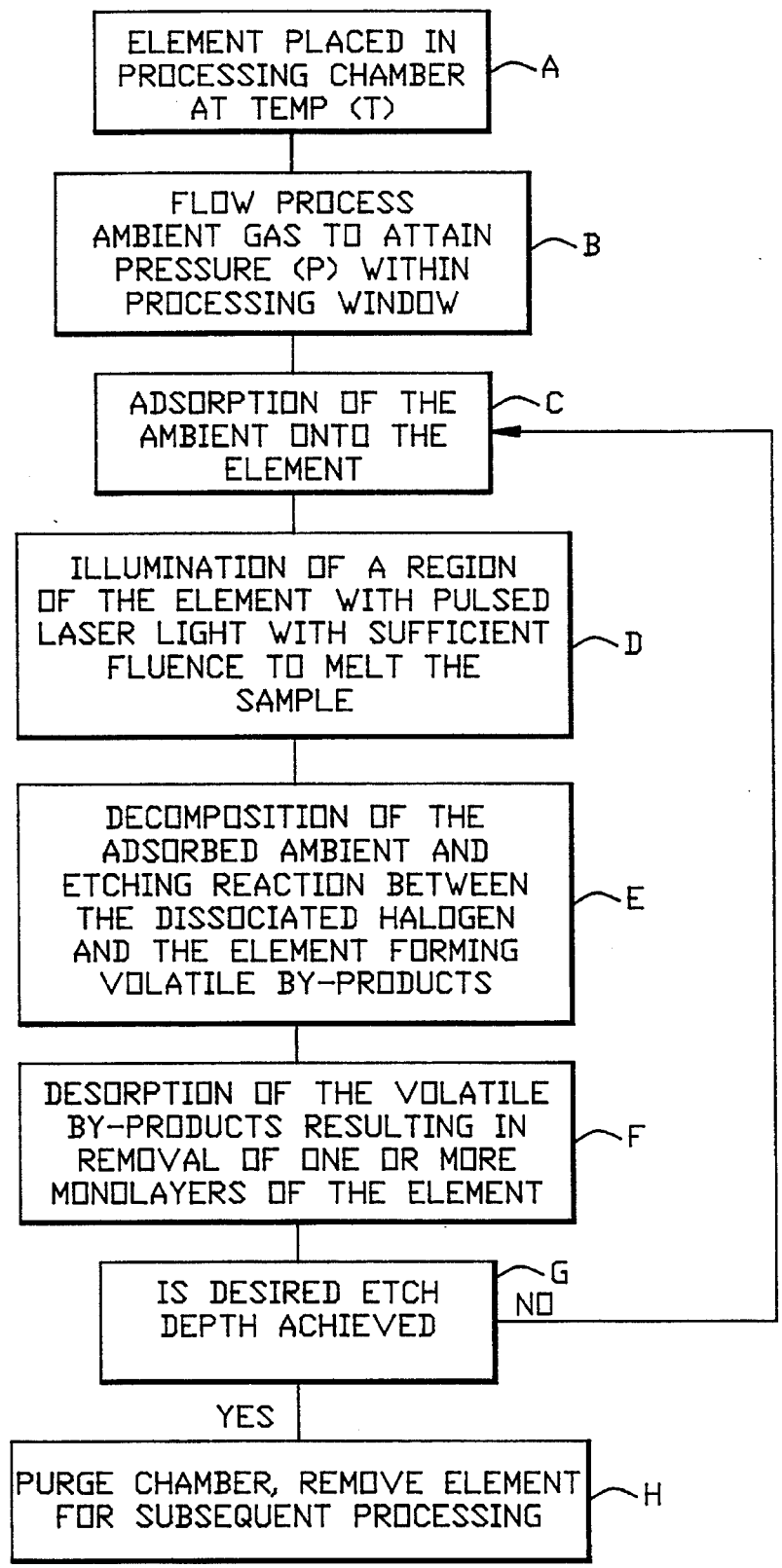
FIG. 2 shows a schematic flow chart of the inventive method.
Figure 5:
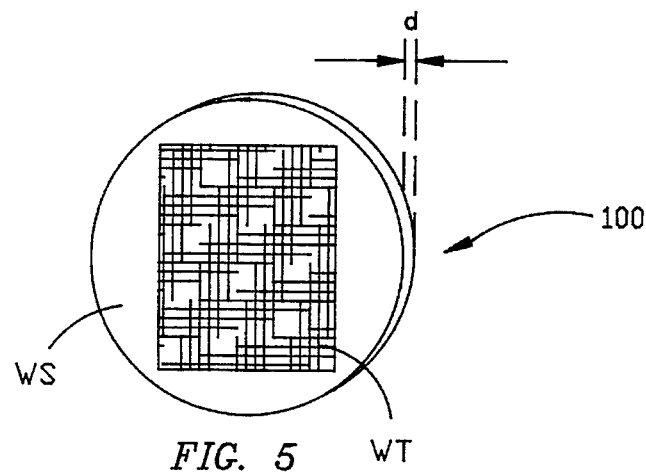
FIG. 5 depicts a representative arrangement having a textured surface for effecting the improved absorption and emission characteristics.

This invention concerns an optical energy (light) stop or energy emitter apparatus 100 or 200 that may be configured as shown in FIGS. 5 and 6, respectively. The energy may be throughout the electromagnetic spectrum including, but not limited to, ultraviolet (UV), visible, and infrared (IR) light. Fabrication of the apparatus may follow the procedure set forth in FIG. 2, in which a surface element S of the apparatus is formed by a contactless texturing process for increasing the surface area of the surface element. By way of example, the description pertains to a silicon element S; however, the procedure may be modified by one experienced in the art within the teachings of this inventive concept for surface texturing of other semiconductors and their associated compounds/alloys as well as materials such as plastics and metals having a wide variety of compositions. For example, this texturing process is particularly well suited for roughening the sidewalls for backside illuminated CCDs.

Element S which may be a wafer, wafer die or packaged device, is placed A within a process gas ambient B, such as a halogen, halocarbon or chlorofluorocarbon, at a predetermined pressure and temperature. There is some adsorption C of the ambient onto the silicon which is selectively illuminated D by a UV excimer laser beam. The illumination effects a decomposition E of the adsorbed process ambient such that the desired region on the surface of the silicon element is melted by the beam and one or more monolayers of silicon are removed or desorbed (etched). The etching reaction occurs since the halogen atom(s) in the adsorbed process ambient dissociates and a volatile species is formed from the reaction between the halogen and the molten silicon. The volatile reaction by-product is desorbed F from the surface and is pumped from the chamber. The process ambient is re-adsorbed onto element S and the process repeats G if desired. The chamber may be purged H and the element removed, if desired. Alternately, the ambient may be substantially vacuum or any other ambient when the laser fluence is adjusted to be sufficient to cause ablation.

Figure 1:
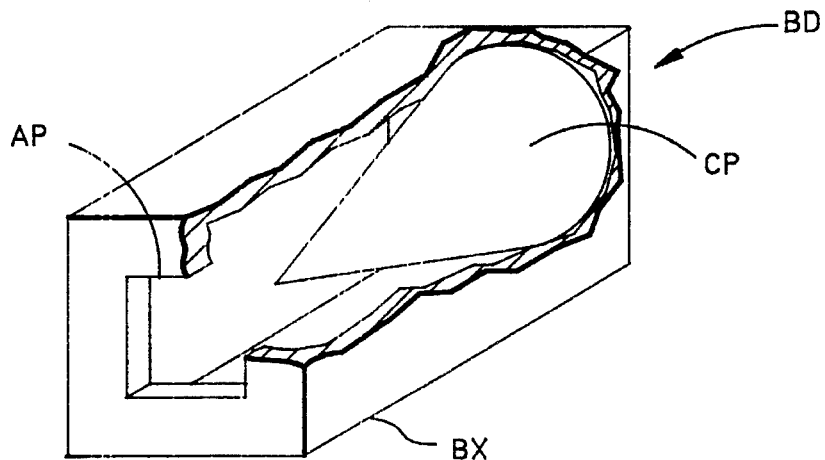
FIG. 1 depicts a prior art apparatus for scattering impinging light.
Figure 3:
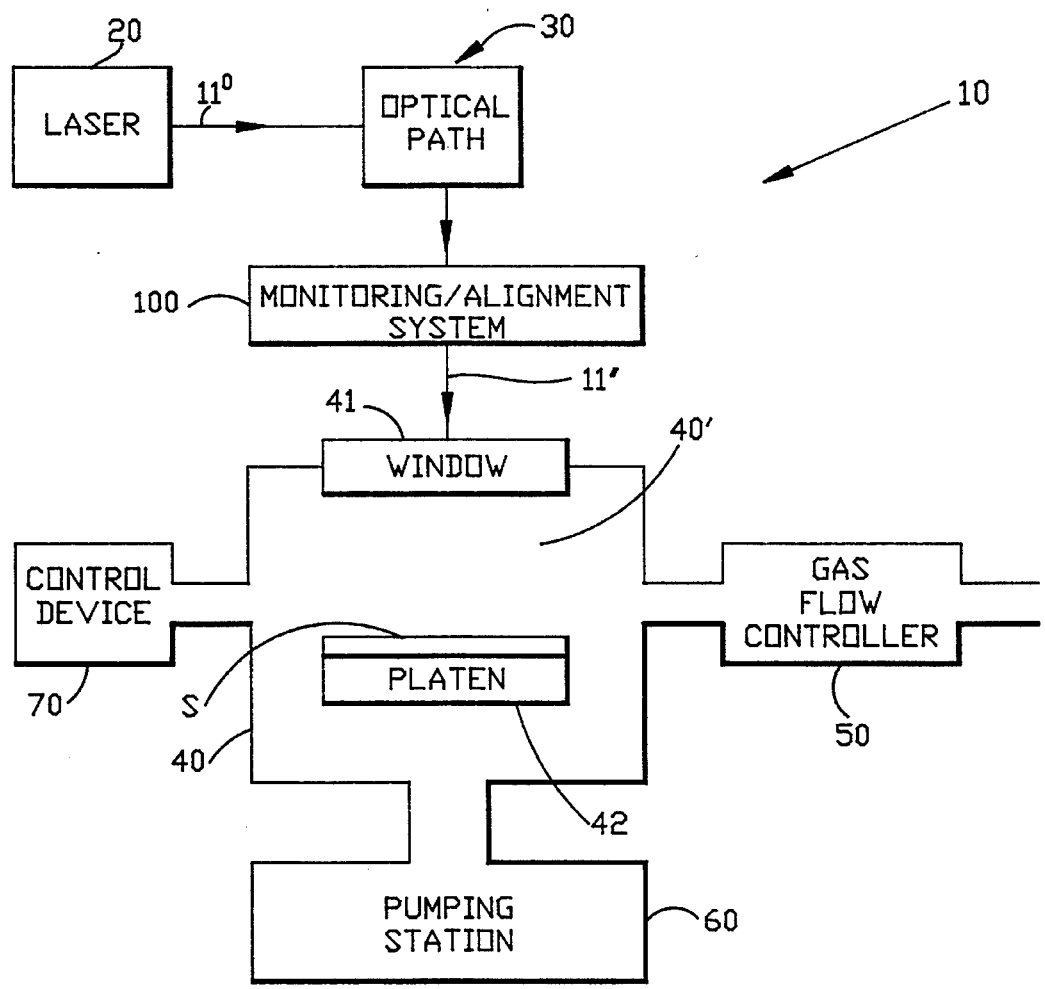
FIG. 3 schematically shows a typical processing set up used for increasing the area of a silicon surface using an excimer laser.

Referring now to FIG. 3 of the drawings, an example of a laser texturing system 10 that effects the above described procedure includes an excimer laser system 20 that emits a beam 11° through an optical path system 30. The optical path system homogenizes, shapes and directs the beam into a processing chamber system 40 containing a process ambient gas 40' and onto element S. A noteworthy arrangement for homogenizing a beam is disclosed in the invention of Stephen D. Russell et al. entitled "Fiber Bundle Homogenizer", U.S. Pat. No. 4,932,747. The homogenizer includes a closely packed ultraviolet grade optical fiber bundle array having its individual fibers intermingled in a random or preconceived format to result in an intermixing of the light from individual fiber cores to produce a uniform intensity profile. The output ends of the fibers are gathered or fused and optionally tapered before being cleaved to provide an output face that is custom shaped for a desired illumination pattern. The flexible nature of the fiber bundle allows for remote materials processing applications. A monitoring/alignment system 100 is interposed between optical path system 30 and processing chamber system 40 and may include a selectably displaceable micromanipulator that may be computer controlled, if desired, to assure that the homogenized beam traces a desired etched pattern on the element. Alternately, chamber system 40 containing element S may be selectively positioned to effect the desired textured pattern on the element.

A gas mass flow controller system 50 is used to flow and pressurize halocarbon (chlorofluorocarbon) process and purge gases with respect to the processing chamber system. Removal of reaction by-products is accomplished via a pumping station 60 connected to the process chamber system. A capacitive manometer-process control device 70 is attached to the process chamber to monitor ambient halocarbon gas pressure. In situ monitoring/alignment system 100 is included for positioning of element S where the laser beam which will impinge on the sample. System 100 may also include a beam diagnostic system, a reflectivity monitor, a laser alignment system, an in-situ monitoring system, and a temporal profile and energy measurement system for additional process control and diagnostics.

The details of the elements of such a system 10 are elaborated in copending U.S. patent application Ser. No. 07/501,707 issued as U.S. Pat. No. 5,385,633 by S. D. Russell et al. referenced above and will make readily apparent to those skilled in the art an more complete appreciation of the salient features of this inventive concept. Appropriate beam deflection optics and/or sample positioning apparatus may be included in the laser texturing system to provide patterned texturing as required for specific applications.

The processing parameters of interest for the increasing of the area of a surface by laser emissions in accordance with this inventive concept are the laser fluence, number of laser pulses, ambient halocarbon gas, and ambient halocarbon gas pressure. Appropriate adjustment and regulation of these parameters in accordance with the capabilities of this inventive concept permits the controlled and desired etch-processing and texturing of a silicon element. Using the procedure and apparatus described above, an improved rough surface on the surface element is provided that functions as an improved light absorber/emitter, which can be extended to other applications as will be apparent to one skilled in the art to which this invention pertains.

Figure 4:
FIG. 4 depicts a typical rough surface fabricated in accordance with the method of this inventive concept.

The very rough surface in a close-packed arrangement of nearly prolate hemi-spheroid shapes as shown in FIG. 4 is produced by laser induced etching or ablation and can be used as an effective light stop in a variety of optical applications including but not limited to laser beam dumps and surfaces where a designer wants to minimize surface reflections. The light stop surface produced by laser texturing is highly durable and its absorptivity will not degrade in time with high intensity light exposure unlike most contemporary deposited absorbers such as black paints which eventually bleach out. A silicon surface element S (typically a thin wafer) is laser textured in accordance with the teachings set out above in a processing ambient of chloropentafluoroethane ambient at 500 torr and is illuminated with about 150 kpulses with a fluence of about 1 J/cm$^2$.

The size and shape of the textured surface area can be varied for the job at hand, but would typically exceed the area illuminated by the impinging light desired for trapping. This is accomplished by step and repeat processing of a uniformly processed area as described above. The textured surface works as an effective light stop or beam dump for infrared, visible and ultra-violet radiation as well as being an improved emitter of these wavelengths Modeling the laser textured surface in a close-packed arrangement of nearly prolate hemi-spheroid shapes as shown in FIG. 4, results in a four-fold increase in surface area under the above laser processing conditions which correspondingly will increase the absorption and emission by that factor.

The blackbody-like, laser textured flat surface configuration shown in FIG. 5, is an ideal shape for insertion into an assembly where laser beam lines are used for set-up, alignment and similar optical routines since it consumes very little space in what is typically very confined quarters. This configuration includes a wafer substrate WS upon which an area WT is laser textured. The substrate thickness (d) would normally be determined by the conventionally supplied wafer or substrate thickness. For example, a 4 inch diameter silicon wafer is typically 525 microns thick. However, laser textured membranes have been fabricated with thicknesses below 50 microns and can be shaped in accordance with this laser textured surface-absorber process; therefore, this invention is not limited by the laser texturing process but by mechanical constraints of the specific materials and application desired. Typically, the wafer substrate is amenable to mounting in conventional optical holders or may have an alternative mounting scheme as desired by the user.

The flat configuration also can be used as an improved emitter of energy for improved conductive and radiative cooling. However, the structure needs to be appropriately oriented to place the textured surface in contact with the ambient so that energy impinging on the backside will be dissipated to the ambient with an increased efficiency via the opposite, textured side. In this case, it may be desired to have the backside textured or untextured.

Figure 6A:
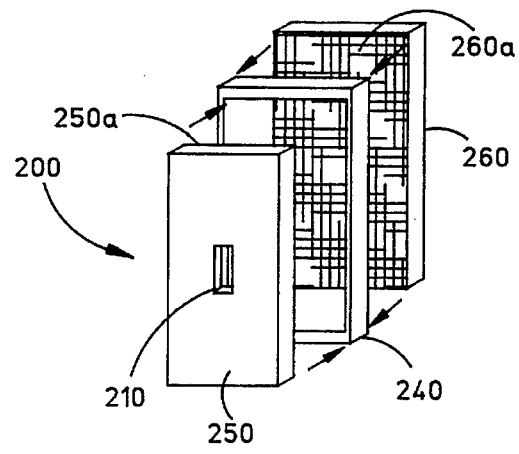
FIGS. 6a–c show other representative arrangement having a textured surface for effecting an improved emission of energy for improved conductive and radiative cooling

Looking to FIG. 6a, the light stop could be fabricated in the configuration of an assembly 200 enclosing a chamber. The substantially enclosed assembly is provided with an entrance aperture 210 on a cover plate 250 that is separated from a rear plate 260 by a spacer 240. The size of the aperture is sufficient to allow entry of the light (energy) sought to be absorbed. Multiple textured absorbing surfaces 260a and 250a are provided on rear plate 260 and inner side of cover plate 250, respectively. Optionally, the assembly could be any number of differently configured hollow structures, for example, substantially hemispherically shaped shells that may be open or closed. But in any configuration, the structure would be provided with the inner walls having at least portions of the inner walls appropriately textured by the laser beam. Extensions to a plurality of such surface absorbers or light stops using repetitions and/or modifications of this baffle structure and/or off-axis configurations can also be envisioned to absorb unwanted reflections as will be apparent to those skilled in the art to which this invention pertains.

Figure 6B:
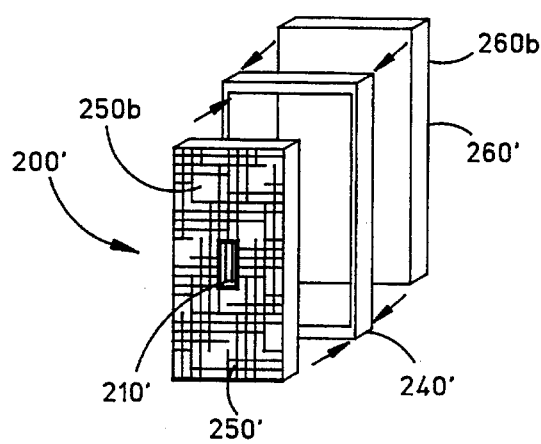

The different configurations of the structures disclosed and envisioned in the preceding paragraph also can be used as improved emitters of energy for improved conductive and radiative cooling, see assembly 200' in FIG. 6b. Appropriately textured surfaces 250b and 260b on front plate 250' and rear plate 260' are provided that are in contact with the ambient. Energy impinging on the backsides (untextured sides) through aperture 210' will be dissipated to the outside ambient with an increased efficiency via the external textured sides.

Thus, the texturing to absorb light by the increased surface area is advantageously utilized to emit greater energy levels. The improved emitters of energy created by at least one appropriately laser textured surface having an increased surface area of emission to increase the emissive power of the surface thereby provides improved conductive and radiative cooling. The various configurations described and envisioned from the foregoing disclosure can be used to increase the levels of emission of energy throughout the electomagnetic spectrum, including but not limited to ultra-violet (UV), visible, and infrared (heat) energy.

Figure 6C:
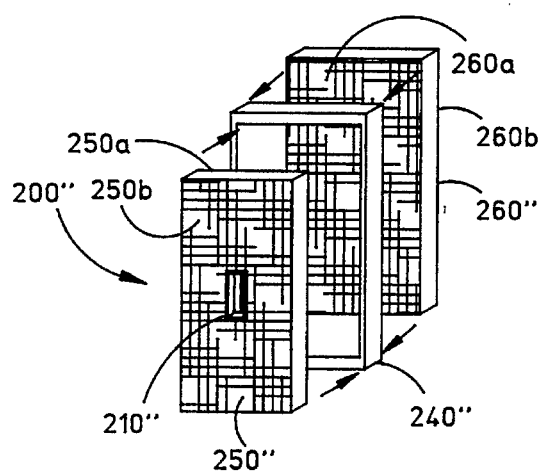

Irrespective of the configuration of the structure, the textured surface material preferably should be of the proper composition to provide the substantially prolate hemi-spheroid surface shapes when processed by the laser beam and will either produce absorbing or emitting as the situation calls for. Silicon is an excellent material for this application of absorbing since it additionally has good thermal conductivity and a high damage threshold. The material if brought above its ablation threshold remains rough. Therefore, damaging a light stop made from silicon with high fluences would be difficult short of fracturing the component. Since heat dissipation is also enhanced by the increased surface area of an appropriately textured surface, this feature further increases the damage threshold of the light stop. Laser texturing not only one side but both sides (the entire front and backside) of the structures of the device, not only provides for a blackbody-like light stop capability but also assures that conductive and radiative cooling can be maximized. This embodiment is schematically depicted in FIG. 6c that has substantially all the internal and external surfaces 250a & 250b and 260a & 260b on front plate 250 and on rear plate 260 textured in accordance with this inventive concept.

As described above, variations required for the job at hand can be easily accommodated by this process. For example, different etching gases (e.g., chlorine, fluorine, chlorofluorocarbons or other halogen containing gases), substrate materials, and suitable processing parameters (laser energy, number of pulses, and the like) can be used to obtain appropriate textured surfaces. The method disclosed herein has applications when or wherever an increased surface area is desirous, for example, to increase adsorption of ambients onto a surface for contamination gettering, or for gaseous sample collection. Alternately, this may be used for preparation of a silicon or other surface for subsequent anodization or other processing or patterning to achieve optoelectronic (light emitting) properties. In this case, the laser textured surface allows enhanced interdiffusion during subsequent processing. The compatibility with conventional semiconductor processing also allows incorporation of this process to enhance absorption and emission of active electronic devices.

Obviously, many modifications and variations of the present invention are possible in the light of the above teachings. It is therefore to be understood that within the scope of the appended claims, the invention may be practiced otherwise than as specifically described.

We claim:

1. An energy absorber including a textured surface formed by laser beam induced etching of the entire surface thereof, said textured surface having peaks and valleys of generally random heights and depths, respectively, providing an increased surface area with respect to a non-laser-etched-surface, and being an absorber of energy that impinges thereon.

2. An energy absorber according to claim 1 including:
   a plurality of textured surfaces, at least one of said plurality of textured surfaces having an aperture.

3. An energy absorber according to claim 1 including:

a hollow structure having an aperture, said textured surface being provided in said hollow structure.

4. An energy absorber according to claim 1 including:

a hollow structure having an aperture and a plurality of said textured surfaces provided in said hollow structure.

5. An energy absorber according to claim 1, 2, 3 or 4 in which said textured surface is configured in hemi-spheroid shapes.

6. An energy emitter including a textured surface formed by laser beam induced etching of the entire surface thereof, said textured surface having peaks and valleys of generally random heights and depths, respectively, providing an increased surface area with respect to a non-laser-etched-surface, and being an emitter of energy therefrom.

7. An energy emitter according to claim 6 including:

a plurality of textured surfaces, at least one of said plurality of textured surfaces having an aperture.

8. An energy emitter according to claim 6 including:

a hollow structure having an aperture, said textured surface being provided in said hollow structure.

9. An energy emitter according to claim 6 including:

a hollow structure having an aperture and a plurality of said textured surfaces provided in said hollow structure.

10. An energy emitter according to claim 6, 7, 8 or 9 in which said textured surface is configured in hemi-spheroid shapes.

11. An energy absorber and emitter including a front side and a backside textured surface formed by laser beam induced etching of the entire surface thereof, said textured surface having peaks and valleys of generally random heights and depths, respectively, providing an increased surface area with respect to a non-laser-etched-surface, and being an absorber of energy that impinges thereon and an emitter of energy therefrom.

12. An energy absorber and emitter according to claim 11 including:

a plurality of textured surfaces, at least one of said plurality of textured surfaces having an aperture.

13. An energy absorber and emitter according to claim 11 including:

a hollow structure having an aperture, said textured surface being provided in said hollow structure.

14. An energy absorber and emitter according to claim 11 including:

a hollow structure having an aperture and a plurality of said textured surfaces provided in said hollow structure.

15. An energy absorber including a textured surface formed by laser beam induced ablation of the entire surface thereof, said textured surface having peaks and valleys of generally random heights and depths, respectively, providing an increased surface area with respect to a non-laser-ablated-surface, and being an absorber of energy that impinges thereon.

16. An energy absorber according to claim 15 including:

a plurality of textured surfaces, at least one of said plurality of textured surfaces having an aperture.

17. An energy absorber according to claim 16 including:

a hollow structure having an aperture and a plurality of said textured surfaces provided in said hollow structure.

18. An energy absorber according to claim 15 including:

a hollow structure having an aperture, said textured surface is provided in said hollow structure.

19. An energy absorber according to claim 15, 16, 17 or 18 configured in hemi-spheroid shapes.

20. An energy emitter including a textured surface formed by laser beam induced ablation of the entire surface thereof, said textured surface having peaks and valleys of generally random heights and depths, respectively, providing an increased surface area with respect to a non-laser-ablated-surface, and being an emitter of energy therefrom.

21. An energy emitter according to claim 20 including:

a plurality of textured surfaces, at least one of said plurality of textured surfaces.

22. An energy emitter according to claim 20 including:

a hollow structure having an aperture and a plurality of said textured surfaces provided in said hollow structure.

23. An energy emitter according to claim 20 including:

a hollow structure having an aperture, said textured surface being provided in said hollow structure.

24. An energy emitter according to claim 20, 21, 22 or 23 configured in hemi-spheroid shapes.

25. An energy absorber and emitter including a frontside and a backside textured surface formed by laser beam induced ablation of the entire surface thereof, said textured surface having peaks and valleys of generally random heights and depths, respectively, providing an increased surface area with respect to a non-laser-ablated-surface, and being an absorber of energy that impinges thereon and an emitter of energy therefrom.

26. An energy absorber and emitter according to claim 25 including: a plurality of textured surfaces, at least one of said plurality of textured surfaces having an aperture.

27. An energy absorber and emitter according to claim 25 including:

a hollow structure having an aperture and a plurality of said textured surfaces provided in said hollow structure.

28. An energy absorber and emitter according to claim 25, 26 or 27 including:

a hollow structure having an aperture, said textured surface being provided in said hollow structure.

* * * * *